United States Patent
Pomichter et al.

(10) Patent No.: US 6,509,766 B1
(45) Date of Patent: Jan. 21, 2003

(54) ADJUSTABLE CLOCK MULTIPLIER AND METHOD

(75) Inventors: Gerald Pomichter, Fairfax, VT (US); Jason Rotella, Mineville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/999,644

(22) Filed: Oct. 26, 2001

(51) Int. Cl.[7] .............................................. H03B 19/00
(52) U.S. Cl. ....................... 327/116; 327/119; 327/113
(58) Field of Search ................................ 327/113, 114, 327/115, 116, 119

(56) References Cited

U.S. PATENT DOCUMENTS

| | | | |
|---|---|---|---|
| 5,563,538 A | 10/1996 | Mukoujima ................. | 327/116 |
| 5,784,543 A | 7/1998 | Marchand ................... | 395/102 |
| 5,818,270 A | 10/1998 | Hamza ........................ | 327/116 |
| 5,847,677 A | * 12/1998 | McCorkle ................... | 342/204 |
| 5,982,208 A | 11/1999 | Kokubo et al. ............. | 327/119 |
| 6,040,726 A | * 3/2000 | Martin ........................ | 327/172 |
| 6,115,439 A | 9/2000 | Andersen et al. ........... | 375/376 |

\* cited by examiner

Primary Examiner—Dinh T. Le
(74) Attorney, Agent, or Firm—Daryl K. Neff

(57) ABSTRACT

An adjustable clock multiplier circuit is disclosed which is believed to be of advantage for inexpensively and locally generating an adjustable high frequency clock, such as may be useful for built-in self test of an embedded memory element of a digital logic integrated circuit. The clock multiplier circuit uses a pulse generator of the monostable type to generate a pulse in response to the leading edge of an input clock signal. The pulse is delayed through a programmable delay circuit and then provided as a feedback input to the pulse generator. In such manner, an output clock signal comprised of a train of pulses is generated during a cycle of the input clock signal. A counter increments a count in response to pulses generated in this way. When the pulse count is too high, a limiter outputs an ADJUST DOWN signal which slows down the output cycle time of the clock multiplier. When the pulse count is too low, the limiter outputs an ADJUST UP signal which speeds up the output cycle time of the clock multiplier. The ADJUST DOWN/UP signals are preferably provided to a register which maintains and outputs a string of control signals for controlling a set of delay elements within a programmable delay circuit. The programmable delay circuit optionally includes a tap point multiplexer for varying the number of delay elements in the delay path, to provide greater range of frequency multiple and faster lock.

20 Claims, 4 Drawing Sheets

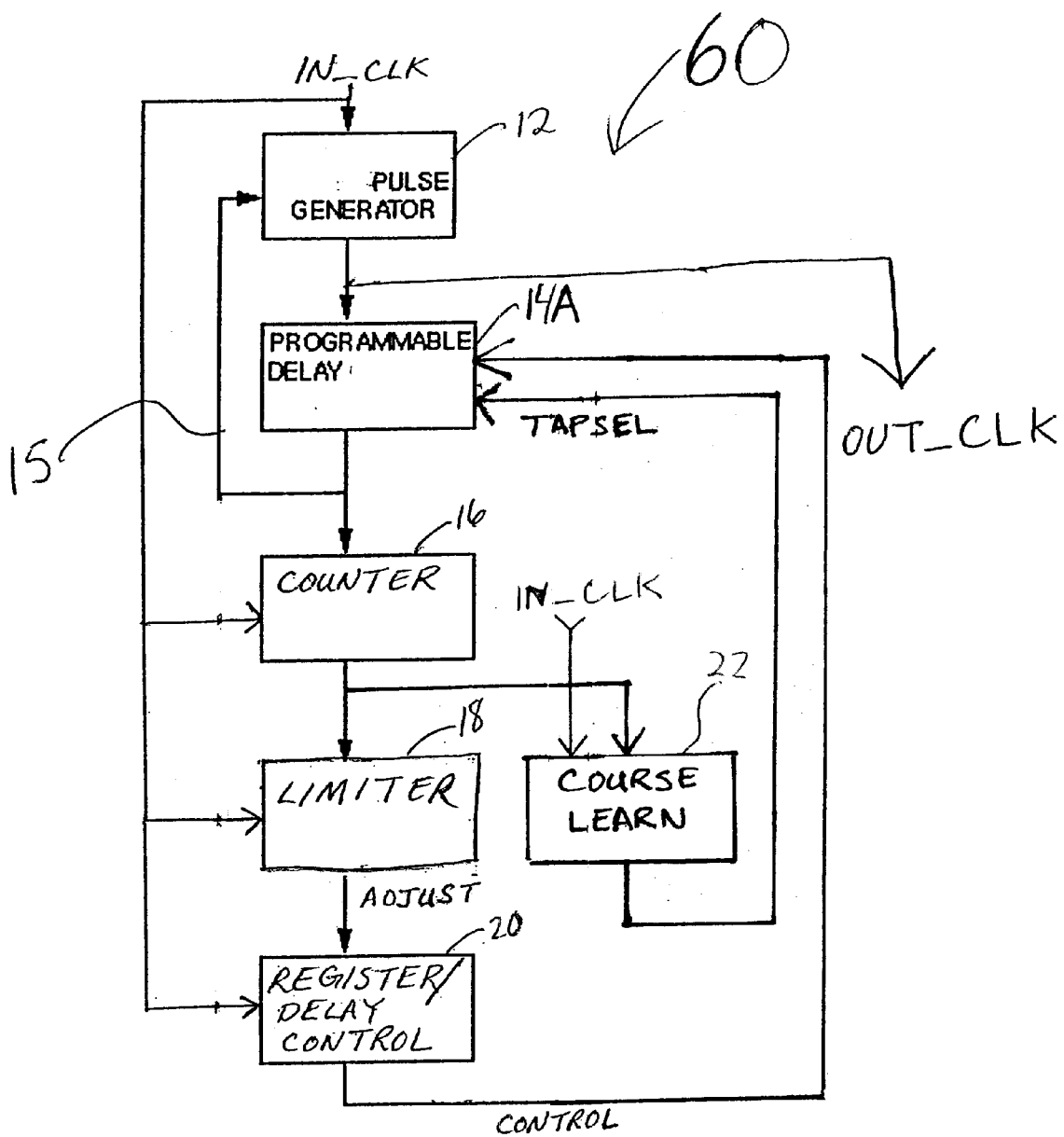

ADJUSTABLE CLOCK MULTIPLIER AND METHOD

FIELD OF THE INVENTION

The present invention relates to electronic clock signal generation, and more specifically to a system and method for adjustably multiplying an input clock signal to obtain a digital output clock signal having a shorter cycle time.

BACKGROUND

Phase locked loops and frequency locked loops are often used to multiply a lower frequency signal up to a higher frequency. However, such circuits require analog voltage controlled oscillators and other components which are not easily integrated within a primarily digital logic integrated circuit, making their cost and power consumption undesirable in all but a few cases where precise analog tuning is required.

There exists a need for an adjustable digital clock multiplier which is easily incorporated into a single, digital logic integrated circuit. In such way, area and power savings may be achieved.

SUMMARY

Accordingly, an adjustable clock signal multiplier is provided for generating an output clock signal having a selected cycle time which is shorter than the cycle time of an input clock signal. The clock signal multiplier includes a pulse generator which is responsive to input including an input clock signal to output a pulse. A programmable delay circuit is coupled to receive and delay the pulse, and is further coupled in feedback relation to the pulse generator to provide the delayed pulse as input thereto, whereby the pulse generator acting together with the programmable delay circuit outputs a train of pulses in response to the input clock signal. A counter is adapted to be incremented based on the train of pulses and is reset in response to the input clock signal. The clock multiplier further includes a limiter which is adapted to adjust a time delay of the programmable delay circuit in response to output of the counter. A longer delay reduces the number of pulses in the output clock signal; a shorter delay increases the number. In this manner, an output clock signal is obtained which has the selected cycle time.

A method is provided by which an input clock signal at an input clock cycle time is multiplied to obtain an output clock signal having a selected cycle time which is shorter than the input clock cycle time. The method includes generating a pulse in response to the input clock signal. The pulse is then delayed by a certain time delay. A second pulse is generated in response to the delayed pulse and that second pulse is also delayed. This process may then be repeated from zero to a plurality of times within the input cycle time to generate a train of pulses which include at least the first and second pulses and perhaps more. Based on the number of pulses in the pulse train, the time delay is adjusted and the above process of generating and delaying pulses repeats until an output clock signal is obtained which has the selected cycle time.

BRIEF DESCRIPTION OF THE DRAWINGS

FIG. 6 is a block diagram illustrating a preferred embodiment of the invention employing a course learn circuit and a tap point multiplexer.

DETAILED DESCRIPTION OF THE PREFERRED EMBODIMENTS

Figure 1:
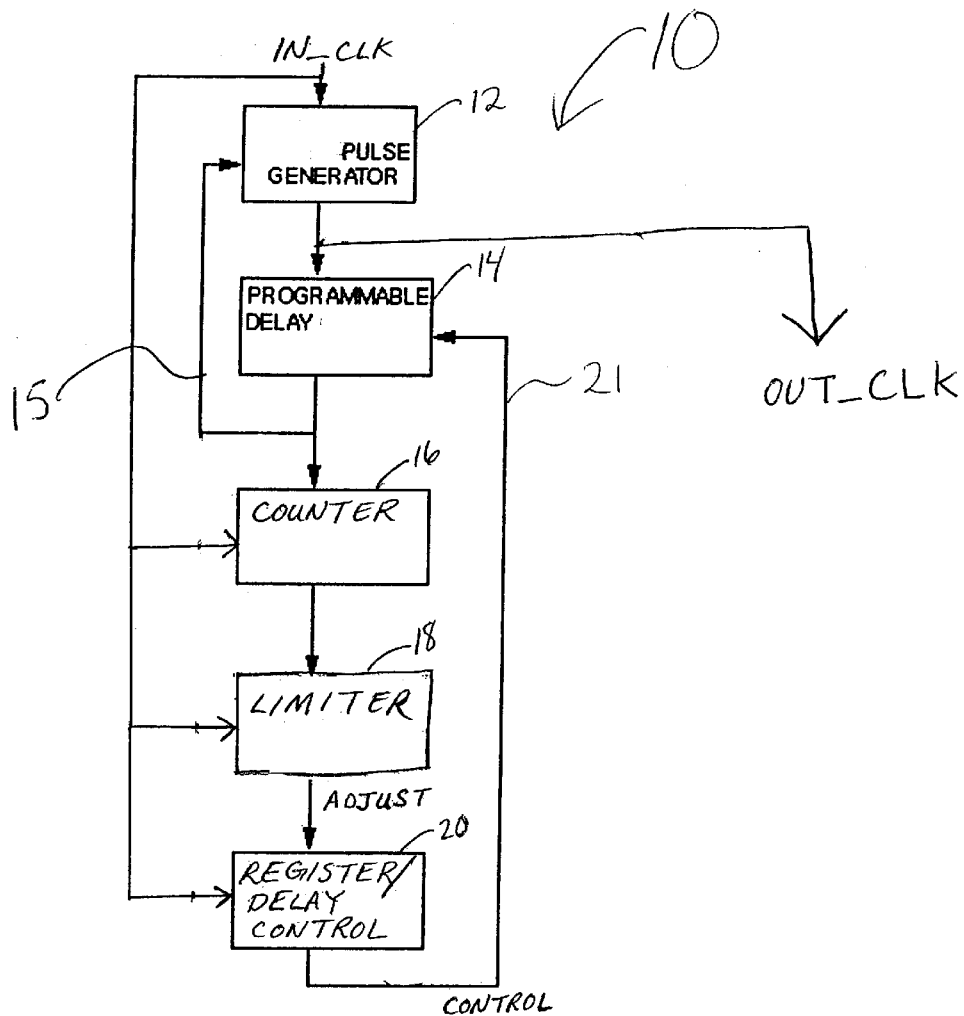
FIG. 1 is a block diagram illustrating a preferred embodiment of the invention.
Figure 2:
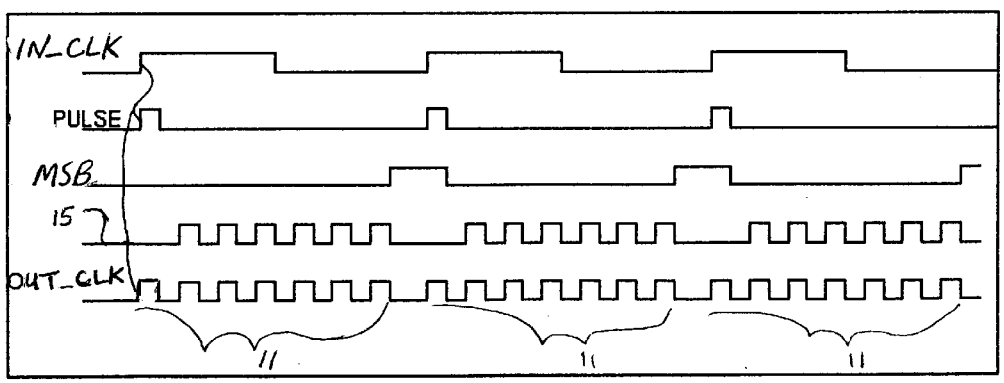
FIG. 2 is a timing diagram illustrating the relationship between signals generated by a preferred embodiment of the invention.

A block diagram of a first embodiment of the invention is shown in FIG. 1. A basic timing diagram is shown in FIG. 2. With reference thereto, a pulse generator 12 of the monostable type, generates a single pulse PULSE in response to an input signal including an input clock signal IN_CLK, preferably upon the rising edge thereof. This pulse becomes a first pulse of the output clock signal OUT_CLK, as will be described more fully below. The output clock signal OUT_CLK is provided as an input to a programmable delay circuit 14. Delay circuit 14 provides a delayed version of the clock signal (OUT_CLK) which is input thereto, delayed by a time duration which is variable as controlled by control input 21 thereto.

The output 15 of programmable delay circuit 14 is provided as a feedback input 15 to pulse generator 12 such that pulse generator 12 generates another pulse in response to the feedback pulse input. Preferably, pulse generator 12 is implemented by two monostable circuits, one generating pulse output responsive to IN_CLK and another generating pulse output responsive to the feedback input 15, with the two outputs being OR'd together to form the output clock OUT_CLK. However, subject to area constraints or other considerations, the input clock signal IN_CLK and the feedback input 15 can instead be OR'd together as one input to a single monostable circuit, and the output of that monostable circuit then being output as OUT_CLK.

A counter 16 increments a count in response to pulses in the output 15 of programmable delay circuit 14. The output of counter 16, which includes at least a most significant bit (MSB) of the count, is provided to a limiter 18. Counter 16 is adapted to be reset in response to the input clock signal IN_CLK, such that a new count is taken for each cycle of IN_CLK.

Based on the value of the output of counter 16, limiter 18 outputs an up or down ADJUST signal to register/delay control circuit 20. The ADJUST signal controls whether the time delay within programmable delay circuit 14 is adjusted upward or downward. Preferably, the most significant bit of the count is output from counter 16 to limiter 18, which then provides the up/down ADJUST signal in response to the state of that most significant bit.

Preferably, on each cycle of IN_CLK, counter 16 is reset to an initial value (MAX−X+1), where MAX is the first value that the most significant bit (MSB) becomes true, and X is the target factor for frequency multiplication. In such manner, MSB becomes true when OUT_CLK reaches the desired frequency multiple of IN_CLK. Limiter 18 then needs only to check status of MSB to produce the up/down ADJUST signal. Thus, in this preferred embodiment, the initial value (MAX−X+1) to which the counter is set, controls the number of pulses in OUT_CLK, and thus, the frequency multiple of OUT_CLK over IN_CLK. Preferably, this value (MAX−X+1) is loaded into a register as a programming input for the clock multiplier and is held there for re-initializing the counter 16 on successive cycles of IN_CLK.

Figure 4:
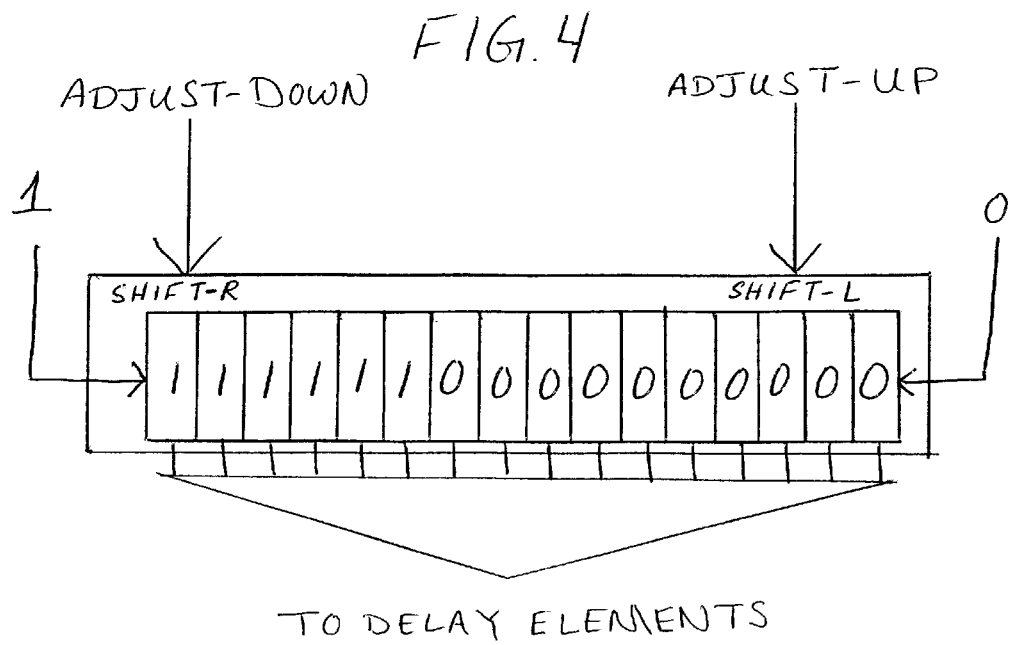
FIG. 4 is a diagram illustrating a shift register implementation for a register 20 of a preferred embodiment of the invention.

Register/delay control circuit 20 generates signals for controlling programmable delay circuit 14 based on the ADJUST signal. This circuit 20 is preferably implemented as a shift register in which ADJUST controls the shift left and shift right function. The shift register contains a string of ones and a string of zeroes, as shown in FIG. 4. The strings of ones and zeroes control the states of a series of delay elements within programmable delay circuit 14, preferably each bit controlling a state of each delay element. For example, each "one" provides a longer delay through a delay element, while each "zero" provides a shorter delay, which may be some delay or no delay. If the ones occupy the left portion of the shift register and the zeroes occupy the right portion, a shift right input causes more ones to appear within the register window and less zeroes. This in turn will cause a greater number of delay elements to have the longer delay, thus increasing delay through programmable delay circuit 14. On the other hand, a shift left input causes more zeroes to appear within the register, in turn causing more delay elements to have the short delay, and thus shortens the total delay through programmable delay circuit 14. During periodic updates, performed preferably once during each cycle of IN_CLK, the strings of ones and zeroes are reloaded to the delay elements, at which time the total delay provided by programmable delay circuit 14 changes. Preferably, updates are performed as a parallel load from the shift register on a single cycle of IN_CLK.

Alternatively, register/delay control circuit 20 can be implemented as a counter which is incremented or decremented once per cycle of IN_CLK based on the value of ADJUST. In such alternative embodiment, the counter maintains a count which is an encoded representation of the signals needed to control individual delay elements of programmable delay circuit 14. For example, a count of 0101 is an encoded binary representation of the signals 00000000 1111 00 1 provided to 15 delay elements and will thus cause 5 delay elements out of a possible 15 delay elements to have the longer delay. In this manner, any unit delay factor between 0 and 15 is represented in a four bit counter. Decoding the count output involves little or no delay since each individual control signal to the delay element, being a "0" or "1", is simply the current count value which is in the 1's place, 2's place, 4's place, 8's place etc. of the count.

Figure 3A:
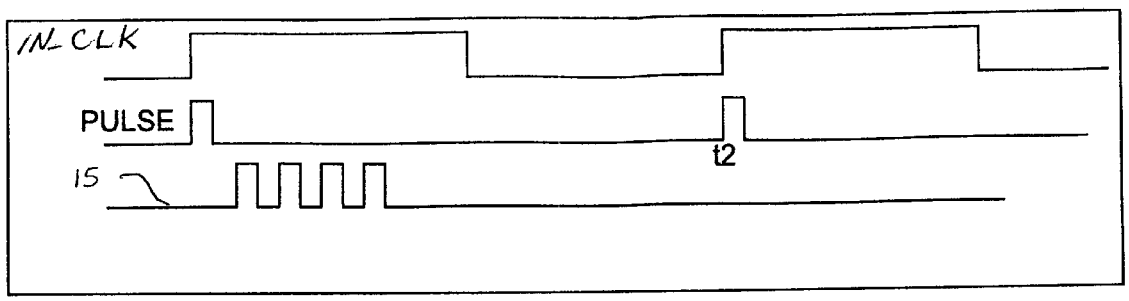
FIGS. 3A and 3B are timing diagrams illustrating the operation of the preferred embodiment of the invention in adjusting the cycle time of the output clock signal.
Figure 3B:
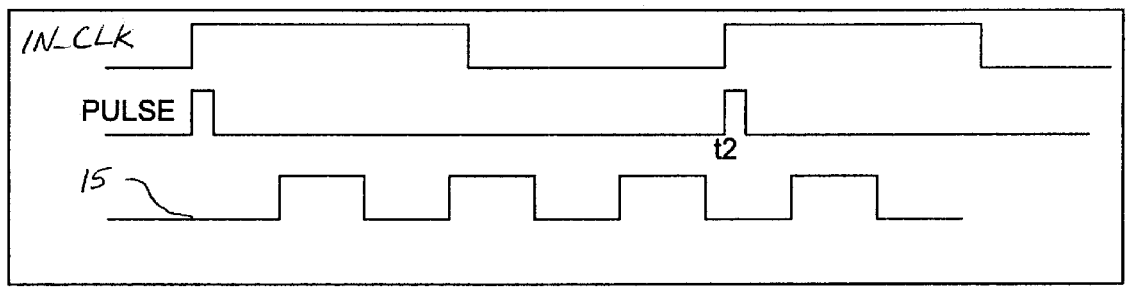

The operation of the first embodiment of the invention will now be further described, with reference to FIGS. 2, 3A and 3B. As illustrated shown in FIG. 2, the input clock signal IN_CLK, having a relatively long cycle time, is input to pulse generator 12. Thereupon, the leading edge of the input clock signal causes a single pulse to be output as PULSE from a monostable circuit within pulse generator 12. By the feedback principle to be explained below, PULSE becomes the first pulse in a train 11 of pulses that form the output clock signal OUT_CLK in each cycle of IN_CLK. In response to the PULSE, programmable delay circuit 14 delays it by a selectable variable amount and outputs the delayed pulse as a feedback input 15 to pulse generator 12, and as input to counter 16.

Pulse generator 12, upon receiving the delayed version of PULSE in the feedback signal 15, once again generates a pulse in response to the leading edge thereof This becomes the second pulse in the train 11 of pulses. Again, the signal is delayed through programmable delay circuit 14, and provided as feedback input 15 to pulse generator 12. This process of generating pulses from the output of programmable delay circuit 14 as fed back to pulse generator 12 continues throughout the clock cycle of IN_CLK unless and until halted when limiter 18 determines that the target pulse count has been reached.

Control over the cycle time of the output clock signal OUT_CLK is effected in the following manner. Counter 16 increments a count in response to pulses in the output 15 of programmable delay circuit 14. The count, or some portion of the count including at least a most significant bit (MSB) is output from counter 16 to limiter 18. Based on the signal received from counter 16, limiter 18 provides an up/down signal ADJUST, which controls the amount of delay that programmable delay circuit 14 provides.

Preferably, counter 16 is initialized once during the beginning of each cycle of IN_CLK to a value (MAX−X +1) where MAX is the lowest number in which the MSB of its count output becomes true, X is the target output frequency multiple and X−1 is the number of pulses in delayed signal 15 per cycle of IN_CLK. In such manner, limiter 18 need only test the value of MSB to determine whether the clock multiplier is running too fast or too slow for that cycle of IN_CLK. Limiter 18 performs the test once each cycle of IN_CLK, preferably upon the leading edge of IN_CLK. In such preferred embodiment, in response to MSB=1, limiter 18 provides an ADJUST DOWN signal to slow down. On the other hand, when MSB=0, limiter 18 outputs an ADJUST UP signal to speed up the clock multiplier 10.

The operation is further illustrated with reference to FIGS. 3A and 3B. Based on the value of ADJUST, a set of delay control signals are updated by register/delay control circuit 20 which are effective during the next cycle of IN_CLK. As described above, a shift register is preferably used for this purpose. FIG. 3A illustrates the case when the target frequency multiple X is 5 and the actual cycle time of OUT_CLK is too fast As shown in FIG. 3A, the pulses in output 15 of programmable delay circuit 14 arrive too quickly within the cycle of IN_CLK. In such case, limiter 18 outputs an ADJUST DOWN signal, which causes the information in shift register (FIG. 4) to be shifted right, thereby causing one or more delay elements within programmable delay circuit 14 to provide longer delay. With the longer delay, OUT_CLK is driven slower during the next cycle of IN_CLK. On the other hand, as shown in FIG. 3B, when the cycle time of OUT_CLK is too slow, too few pulses appear in OUT_CLK before the next leading edge of IN_CLK. In this case, only three pulses appear. In such case, limiter 18 outputs an ADJUST UP signal, which causes the information in shift register (FIG. 4) to be shifted left, thereby causing one or more delay elements within programmable delay circuit 14 to provide shorter delay. With less delay, OUT_CLK will be driven faster during the next cycle of IN_CLK.

In the above described embodiment of the invention, it will be understood that the time delay through programmable delay circuit 14 is subject to change with each successive cycle of IN_CLK. If substantial jitter is present in the input clock signal IN_CLK provided to clock multiplier 10, it may be undesirable to update the time delay on each cycle of IN_CLK. Accordingly, in an alternative arrangement and method, the time delay of programmable delay circuit 14 is updated only once for every N cycles of the IN_CLK, so as to update the time delay based on an average of the number of pulses actually appearing in OUT_CLK. In such alternative embodiment, clock multiplier 10 is arranged in the following manner. Counter 16, instead of being reset to the value MAX−X+1 upon each cycle of IN_CLK, is reset to N times (MAX−X+1) instead. In such manner, counter 16 counts the pulses in signal 15 over N cycles of IN_CLK, until either N times MAX is reached or is not reached by the end of the Nth cycle. Limiter 18 and register/delay control circuit 20 operate as described above. If N times MAX is reached by the end of the Nth cycle, MSB becomes true, and limiter 18 provides an ADJUST DOWN signal to register/delay control circuit 20 which then signals programmable delay circuit 14 to provide a longer time delay. If N times MAX is not reached by the end of the Nth cycle, MSB is not true, and limiter 18 provides an ADJUST UP signal to register/delay control circuit 20 which then signals programmable delay circuit 14 to provide a shorter time delay.

The arrangement and operation of another preferred embodiment of the invention will now be described, with reference to FIGS. 5 and 6. FIG. 6 is a block diagram illustrating this other preferred embodiment for a clock multiplier 60 which includes a course learn circuit 22 for assisting in more rapidly reaching locked condition and a tap point multiplexer delay circuit 14A (FIG. 5) adapted to produce a wider range of delays, making possible a greater frequency range of OUT_CLK. The course learn circuit 22 is used together with a preferred type of programmable delay circuit 14A to rapidly determine a control input TAPSEL to programmable delay circuit 14A by which an approximation of the correct time delay through delay circuit 14A is produced. Course learn circuit 22 includes a counter which counts cycles of IN_CLK, and a control signal generator for outputting TAPSEL. Such control signal generator is most preferably implemented as a counter which is incremented once every four cycles of IN_CLK, but is subject to being halted when the approximately correct time delay is reached. The operation of course learn circuit 22 will be more fully described below, after describing other features of this particular embodiment.

Figure 5:
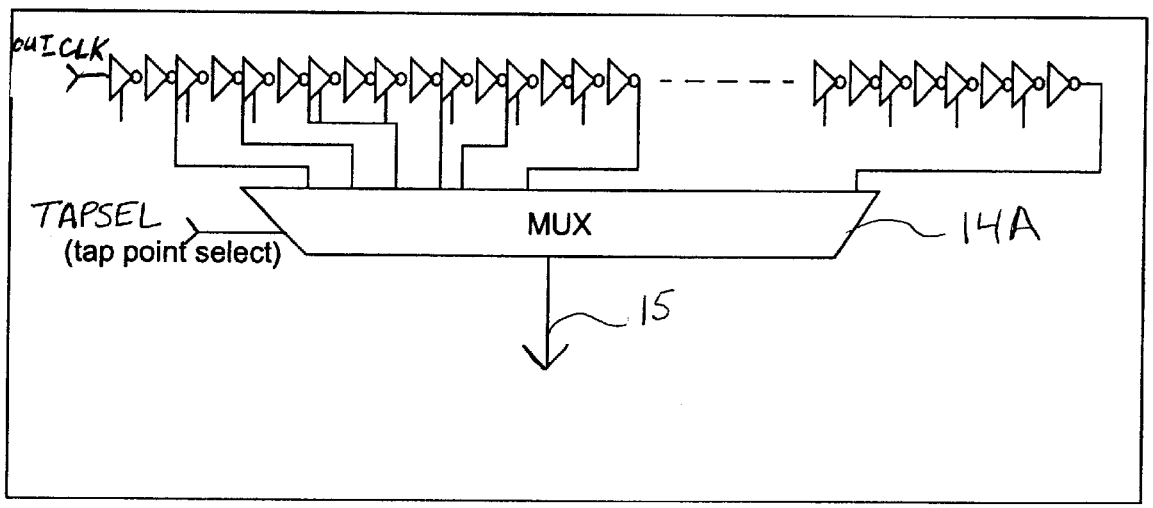
FIG. 5 is a diagram illustrating a tap point multiplexer implementation of a programmable delay circuit used in an embodiment of the invention.

FIG. 5 is a block diagram illustrating a tap point multiplexer type of programmable delay circuit 14A used in this embodiment of the invention. As shown in FIG. 5, the output 15 of multiplexer is a delayed version of the OUT_CLK signal input thereto. The amount of time delay through delay circuit 14A is determined in two ways. First, control input TAPSEL (tap select) selects the output from one of 16 tap points in a chain of 64 delay elements, for example. The tap points are selected to provide exponentially increasing delay so that a wide range of delays are produced. For example, TAPSEL=0 selects a signal delay path through three delay elements, while TAPSEL=10 selects a signal delay path through 22 delay elements, and TAPSEL=12 selects a signal delay path through 33 delay elements.

The second way that programmable delay circuit 14A controls the time delay therethrough is by controlling the time delay through individual delay elements. As described above with reference to FIG. 1, each individual delay element provides at least two different delays: a long time delay, and a short time delay (or none), the amount of delay being selected by control input thereto. Other aspects of control and operation of the individual delay elements are as described above with reference to FIG. 1.

The operation of the embodiment of FIG. 6 will now be described. At startup, or whenever the clock cycle of IN_CLK changes substantially, or the desired frequency multiple X changes, course learn circuit 22 is initialized to begin determining the proper tap point control over programmable delay circuit 14A which produces the approximately correct time delay. At this point in time, all of the individual delay elements of programmable delay circuit 14A are preferably set to their longest individual delays. The tap point control TAPSEL is set to zero to select a delay path containing the fewest number of delay elements. The clock multiplier 60 is now set to begin determining the correct tap point of programmable delay circuit 14A (FIG. 5) which produces the approximately correct time delay. This procedure is preferably performed over 64 cycles of IN_CLK. During the first four cycles, TAPSEL=0 is set to provide the shortest delay through delay circuit 14A. During a first cycle of IN_CLK, counter 16 counts up the pulses in signal 15 as described above with respect to FIG. 1 and provides at least the most significant bit (MSB) portion of the count as output to course learn circuit 22. On the first cycle of IN_CLK, counter 16 is initialized to a value MAX−X+1 such that the counter reaches MAX (MSB becomes true) if the target pulse count is reached on that first cycle of IN_CLK.

If MSB becomes true during this first cycle, then OUT_CLK is considered to be running too fast and TAPSEL is considered to select a tap with too short a delay. OUT_CLK is shut off during the remaining three cycles of the four cycle interval to allow internal clocks and signals to settle out before proceeding. During the next four cycle interval of IN_CLK, TAPSEL is incremented to TAPSEL=1 and the process repeats. If MSB is true again, OUT_CLK is still too fast and the process repeats again. However, when a value of TAPSEL is determined in which MSB does not become true, that value of TAPSEL is maintained as the correct tap point control. At the end of the 64 input clock cycles, that TAPSEL value is maintained for further operation of the clock multiplier 10.

At this point, the correct tap point having been determined, finer control can now be effected over the time delay in delay circuit 14A. This is done by adjusting the time delay of individual delay elements which are within the delay path of delay circuit 14A which is selected by the current TAPSEL value. The process for adjusting the individual time delays of the delay elements is performed as described above relative to FIG. 1.

The invention now having been described with respect to certain preferred embodiments thereof, it will be recognized the many modifications and enhancements which can be made without departing from the true scope and spirit of the invention, as limited only by the claims herein appended.

What is claimed is:

1. A method of multiplying an input clock signal having a first cycle time to obtain an output clock signal having a selected cycle time which is shorter than said first cycle time, comprising:
    a) generating a pulse in response to an input clock signal, said input clock signal having a first cycle time;
    b) delaying said pulse by a time delay;
    c) generating a second pulse in response to said delayed pulse;
    d) delaying said second pulse by said time delay;
    e) repeating c) and d) zero or more times to generate a train of pulses including said delayed pulse and at least one said second pulse, said train of pulses being generated within said first cycle time;
    f) adjusting said time delay based on a number of pulses in said pulse train, and repeating a) through f) to obtain an output clock signal having a selected cycle time which is shorter than said first cycle time.

2. The method of claim 1 further comprising incrementing a counter in response to said pulses in said pulse train, wherein said number is represented by an output of said counter.

3. The method of claim 2 wherein said time delay is adjusted responsive to thresholding said output of said counter.

4. The method of claim 3 further comprising setting said counter to an initial value prior to said incrementing, said initial value being selected based on said selected cycle time.

5. The method of claim 1 further comprising representing said time delay in a register.

6. The method of claim 5 wherein said time delay is produced by a series of delay elements and said time delay is adjusted by varying a delay of each said delay element.

7. The method of claim 6 wherein said register represents said time delay as a string of signals, each signal controlling said delay for a different said delay element.

8. The method of claim 6 wherein said register represents said time delay as an encoded representation of a string of signals, each signal controlling said delay for a different said delay element.

9. The method of claim 1 wherein said number is averaged over a plurality of cycles of said input clock signal.

10. The method of claim 6 wherein said time delay is adjusted by varying the number of delay elements in said series prior to varying said delay of each said element.

11. An adjustable clock signal multiplier for generating an output clock signal having a selected cycle time which is shorter than a first cycle time of an input clock signal, comprising:
   a pulse generator responsive to input including an input clock signal to output a pulse;
   a programmable delay circuit coupled to receive and delay said pulse, and further coupled in feedback relation to said pulse generator to provide said delayed pulse as input thereto, whereby said pulse generator acting together with said programmable delay circuit outputs a train of pulses in response to said input clock signal;
   a counter, adapted to be incremented in response to said train of pulses, said counter being reset in response to said input clock signal; and
   a limiter adapted to adjust a time delay of said programmable delay circuit in response to an output of said counter, said time delay controlling the number of pulses output by said pulse generator per cycle of said input clock signal, such that said number of pulses output by said pulse generator per cycle of said input clock signal is adjusted to correspond to said selected cycle time.

12. The adjustable clock multiplier of claim 11 further comprising a register responsive to output of said limiter to change and store a current state of delay of said programmable delay element.

13. The adjustable clock multiplier of claim 11 wherein said limiter adjusts said delay based only on a most significant bit of said output of said counter.

14. The adjustable clock multiplier of claim 13 wherein said counter is initialized to a first value such that said most significant bit becomes true when said pulses in said train of pulses reaches a desired number.

15. The adjustable clock multiplier of claim 11 wherein said programmable delay circuit comprises a series of delay elements, each said delay element having a variable delay.

16. The adjustable clock multiplier of claim 15 wherein said programmable delay circuit further comprises a tap point multiplexer including said series of delay elements, wherein said time delay is varied by varying a number of delay elements in said series.

17. The adjustable clock multiplier of claim 16 wherein said number of delay elements is adapted to be varied prior to varying a delay of one or more said delay elements.

18. The adjustable clock multiplier of claim 12 wherein said current state of delay is represented as a string of signals, each signal controlling said variable delay for a different said delay element.

19. The adjustable clock multiplier of claim 12 wherein said current state of delay is represented as an encoded representation of a string of signals, each signal controlling said variable delay for a different said delay element.

20. The adjustable clock multiplier of claim 12 wherein said limiter is adjusts said delay once every Nth cycle of said input clock signal and said counter is initialized to a second value every said Nth cycle such that said most significant bit becomes true when said pulses in said train of pulses reaches a desired number within N cycles of said input clock signal, such that said delay is adjusted based on averaging said selected cycle time over said N cycles.

* * * * *